(12) United States Patent
Yu

(10) Patent No.: US 8,207,766 B2
(45) Date of Patent: Jun. 26, 2012

(54) METHOD AND APPARATUS FOR QUANTIZATION NOISE REDUCTION IN FRACTIONAL-N PLLS

(75) Inventor: Qicheng Yu, Lexington, MA (US)

(73) Assignee: Silicon Laboratories Inc., Austin, TX (US)

( * ) Notice: Subject to any disclaimer, the term of this patent is extended or adjusted under 35 U.S.C. 154(b) by 59 days.

(21) Appl. No.: 12/732,029

(22) Filed: Mar. 25, 2010

(65) Prior Publication Data

US 2011/0234269 A1    Sep. 29, 2011

(51) Int. Cl.
*H03L 7/06* (2006.01)
(52) U.S. Cl. .......................... 327/156; 327/147
(58) Field of Classification Search .............. 327/147, 327/156
See application file for complete search history.

(56) References Cited

U.S. PATENT DOCUMENTS

| | | | |
|---|---|---|---|
| 5,436,596 A | 7/1995 | Folmer | |
| 6,130,561 A | 10/2000 | Dufour | |
| 6,590,426 B2 | 7/2003 | Perrott | |
| 7,068,110 B2 | 6/2006 | Frey et al. | |
| 7,072,433 B2* | 7/2006 | Bell | 375/376 |
| 7,250,808 B2* | 7/2007 | Yoshimura | 327/536 |
| 7,388,415 B2* | 6/2008 | Lee | 327/158 |
| 7,400,204 B2 | 7/2008 | Thomsen et al. | |
| 7,728,631 B2* | 6/2010 | Nathawad | 327/12 |
| 7,816,941 B2* | 10/2010 | Kim et al. | 326/30 |
| 2002/0113660 A1* | 8/2002 | Dally et al. | 331/135 |
| 2003/0222723 A1 | 12/2003 | Kawahara | |
| 2004/0000934 A1* | 1/2004 | Jeon | 327/115 |
| 2004/0100312 A1* | 5/2004 | Cho | 327/158 |
| 2004/0212413 A1* | 10/2004 | Lee | 327/158 |
| 2007/0126484 A1 | 6/2007 | Lin et al. | |
| 2008/0001642 A1* | 1/2008 | Yun et al. | 327/161 |
| 2008/0101140 A1* | 5/2008 | Jeong et al. | 365/193 |
| 2008/0211588 A1 | 9/2008 | Frey et al. | |
| 2009/0115450 A1* | 5/2009 | Kim et al. | 326/30 |
| 2009/0285279 A1 | 11/2009 | Nathawad | |
| 2010/0327916 A1* | 12/2010 | Ahmadi et al. | 327/107 |
| 2011/0156766 A1* | 6/2011 | Ahn et al. | 327/142 |
| 2011/0156767 A1* | 6/2011 | Ahn et al. | 327/142 |
| 2011/0181468 A1* | 7/2011 | Sun et al. | 342/357.73 |
| 2011/0234269 A1* | 9/2011 | Yu | 327/155 |
| 2011/0234272 A1* | 9/2011 | Yu | 327/157 |

OTHER PUBLICATIONS

European Extended Search Report and Written Opinion mailed Jul. 13, 2011 in EP App. No. 11159357.0, 7 pages.

Baird, R. and Fiez, T., "Improved ΔΣ DAC linearity using data weighted averaging", Proc. IEEE Internat. Symposium on Circuits and Systems, pp. 13-16, May 1995.

M. Gupta, and Song, B., "A 1.8 GHz spur cancelled fractional-N frequency synthesizer with LMS based DAC gain calibration," IEEE J. Solid-State Circuits, vol. 41, No. 12, pp. 2842-2851, Dec. 2006.

(Continued)

*Primary Examiner* — Lincoln Donovan
*Assistant Examiner* — Adam Houston
(74) *Attorney, Agent, or Firm* — Zagorin O'Brien Graham LLP

(57) ABSTRACT

A first current source supplies a first charge amount responsive to a first pulse signal from the phase frequency detector and a second current source supplies a second charge amount according to a fixed value and a variable value. The variable value corresponds to a phase difference between a first feedback clock signal and a hypothesized feedback clock signal with reduced quantization noise. The first and second charge amounts are of opposite polarity. A single set of first and second current sources perform the functions of charge pump and noise reduction DAC.

24 Claims, 5 Drawing Sheets

OTHER PUBLICATIONS

Pamarti, S. et al., "A wideband 2.4 GHz delta-sigma fractional-N PLL with 1-Mb/s in-loop modulation," IEEE J. Solid-State Circuits, vol. 39, No. 1, pp. 49-62, Jan. 2004.

S. Meninger, and Perrott, M., "A 1 MHz bandwidth 3.6 GHz 0.18 μm CMOS fractional-N synthesizer utilizing a hybrid PFD/DAC structure for reduced broadband phase noise," IEEE J. Solid-State Circuits, vol. 41, No. 4, pp. 966-980, Apr. 2006.

S. Meninger, and Perrott, M., "A fractional-N frequency synthesizer architecture utilizing a mismatch compensated PFD/DAC structure for reduced quantization-induced phase noise," IEEE Trans. Circuits Syst. II, Analog Digit. Signal Process., vol. 50, No. 11, pp. 839-849, Nov. 2003.

Swaminathan, A. et al., "A wide-bandwidth 2.4GHz ISM-band fractional-N PLL with adaptive phase-noise cancellation," IEEE J. Solid-State Circuits, vol. 42, No. 12, pp. 2639-2650, Dec. 2007.

Temporiti, E. et al., "A 700kHz bandwidth ΔΣ fractional synthesizer with spurs compensation and linearization techniques for WCDMA applications," IEEE J. Solid-State Circuits, vol. 39, No. 8, pp. 1446-1454, Sep. 2004.

Zhang, L. et al., "A hybrid spur compensation technique for finite modulo fractional-N phase-locked loops," IEEE J. Solid-State Circuits, vol. 44, No. 11, pp. 2922-2934, Nov. 2009.

Zhang, G., "Linearised Charge Pump Independent of Current Mismatch Through Timing Rearrangement," Electronics Letters, vol. 46, No. 1, Jan. 7, 2010, 2 pages.

\* cited by examiner

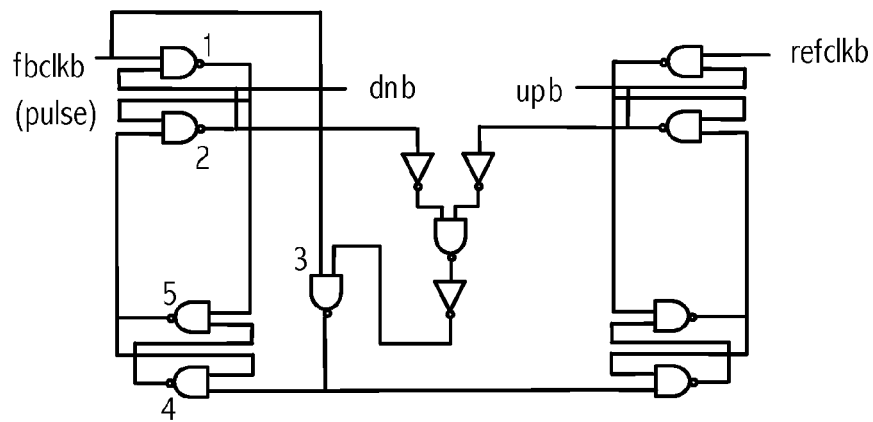
*FIG. 4*
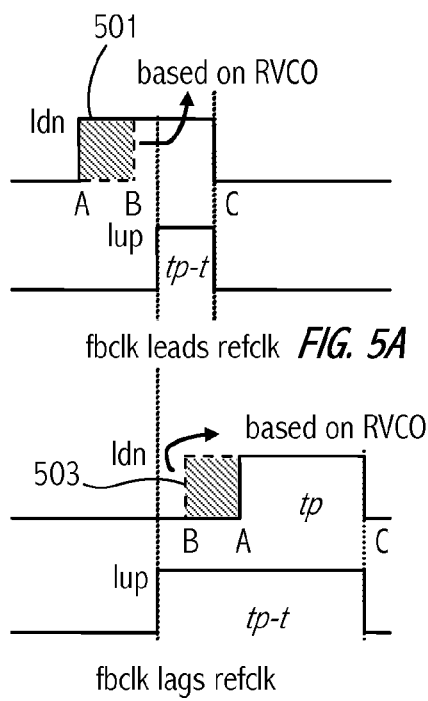
*FIG. 5A*
*FIG. 5B*
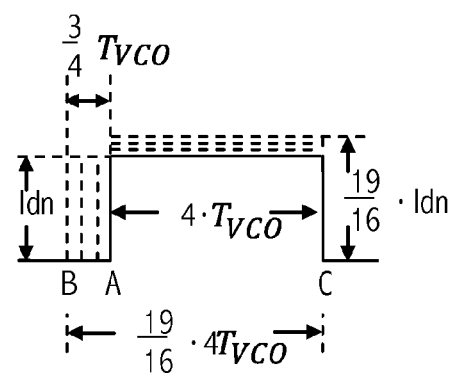
*FIG. 5C*

METHOD AND APPARATUS FOR QUANTIZATION NOISE REDUCTION IN FRACTIONAL-N PLLS

CROSS-REFERENCE TO RELATED APPLICATION(S)

This application is related to Application Number 12/732,024, filed Mar. 25, 2010 entitled "METHOD AND APPARATUS FOR CHARGE PUMP LINEARIZATION IN FRACTIONAL-N PLLS," naming Qicheng Yu as inventor, which application is incorporated herein by reference in its entirety.

BACKGROUND

1. Field of the Invention

This application relates to fractional-N phase-locked loops and more particularly to correcting shortcomings in such phase-locked loops (PLLs).

2. Description of the Related Art

Wide band fractional-N PLLs see increasing demand in various fields, especially wireless communications. Large bandwidth of the PLL helps suppress the intrinsic noise of the VCO, and provides fast settling time during frequency switching.

Unlike an integer-N PLL, the feedback divider output clock (fbclk) leads and lags the reference clock (refclk) regularly in a fractional-N PLL due to an ever-changing frequency divider ratio. The change is necessary to maintain an average VCO clock to reference clock frequency ratio that contains a fraction. This quantization noise of the feedback clock phase is injected through the phase-frequency detector (PFD) and charge pump (CP), and easily becomes the dominant noise source of the system. Meanwhile, the CP exhibits nonlinearity, mainly due to the size mismatch between the up and down current sources. High frequency quantization noise is modulated by the nonlinearity down into the pass band of the PLL, corrupting the output clock.

Referring to FIG. 1, illustrated is a typical tri-state PFD used to drive the charge pump of a PLL. In locked steady state operation, the rising edge of the refclk triggers the up output pulse and the rising edge of the fbclk triggers the down output pulse. A short delay after both pulses rise, the PFD is reset and both pulses clear simultaneously (FIG. 1(b)). The total charge Q delivered by the charge pump to the loop filter is $$Q = I_{up} \cdot t_d - I_{dn} \cdot t - I_{dn} \cdot t_d$$

when fbclk leads, and $$Q = I_{up} \cdot (-t) + I_{up} \cdot t_d - I_{dn} \cdot t_d$$

when fbclk lags. Here t is the time by which the fbclk leads refclk, $t_d$ is the delay of reset in the PFD, and $I_{up}$ and $I_{dn}$ are the value of up and down current sources. Q is nonlinear with respect to t if $I_{up} \neq I_{dn}$, causing the high frequency quantization noise in the phase of fbclk to alias into the PLL bandwidth.

Another source of error as described above is the quantization noise due to the feedback divider output clock (fbclk) leading and lagging the reference clock (refclk) regularly in a fractional-N PLL due to an ever-changing frequency divider ratio. The common approach to quantization noise reduction is to add dedicated current sources to implement a canceling digital to analog converter (DAC), which delivers a charge that is nearly the opposite of the quantization noise. A typical fractional-NPLL with quantization noise reduction is shown in FIG. 1C. The delta-sigma modulator (DSM) 150 not only determines the instantaneous feedback divider ratio for multi-modulus divider 152, but also provides the phase difference of the fbclk relative to the refclk for the digital control circuit 154 for the cancellation digital to analog converter (DAC) 156. The DAC 156 is typically a separate bank of current sources, each of which may turn on for a short duration that is approximately aligned with the charge pump (CP) current pulses. The DAC is controlled by a second delta-sigma modulator (DAC DSM) 154 that modulates its own quantization noise out of the PLL pass band. The penalties to pay for the added circuit components include thermal and 1/f noise, switch charge injection, error charge due to component mismatch, device leakage current and supply current. While the average total current is zero, the different current pulses have different amplitude, duration and skew, resulting in residual noise at high frequencies.

Thus, improvements at controlling noise, charge injection, mismatch error and leakage current in a PLL are desirable.

SUMMARY

Accordingly, an embodiment of the invention provides a method of reducing quantization noise that includes supplying a first current with a first polarity from a first current source according to a first pulse signal from a phase frequency detector. A second current source supplies a second current with a second polarity according to a fixed-width second pulse signal and a predetermined first value and a variable second value. The variable second value corresponds to a phase difference between a first feedback clock signal and a desired location of the feedback clock signal.

In another embodiment an apparatus is provided that includes a phase frequency detector. A first current source supplies a first charge amount responsive to a first pulse signal from the phase frequency detector and a second current source supplies a second charge amount according to a fixed value and a variable value. The variable value corresponds to a phase difference between a first feedback clock signal and a hypothesized feedback clock signal. The first and second charge amounts are of opposite polarity.

In another embodiment an apparatus is provided that includes a phase frequency detector. A first current source supplies first current of a first polarity responsive to a first pulse signal from the phase frequency detector. A second current source supplies a second current of a second polarity responsive to a fixed-width second pulse signal and according to a fixed value combined with a variable value, the variable value selected to reduce quantization error associated with a feedback divider circuit. The fixed width second pulse signal determines how long the second current is supplied (the width of the current pulse) and the fixed value and the variable value determine the magnitude of the second current.

BRIEF DESCRIPTION OF THE DRAWINGS

The present invention may be better understood, and its numerous objects, features, and advantages made apparent to those skilled in the art by referencing the accompanying drawings.

FIG. 4 illustrates a NAND gate implementation of the linearizing PFD shown in FIG. 2.

FIG. 5A illustrates timing with an imagined RVCO where fbclk leads refclk.

FIG. 5B illustrates timing with an imagined RVCO where refclk leads fbclk.

FIG. 5C illustrates an example where the RVCO clock period is $T_{VCO}/4$.

The use of the same reference symbols in different drawings indicates similar or identical items.

DESCRIPTION OF THE PREFERRED EMBODIMENT(S)

Figure 2:
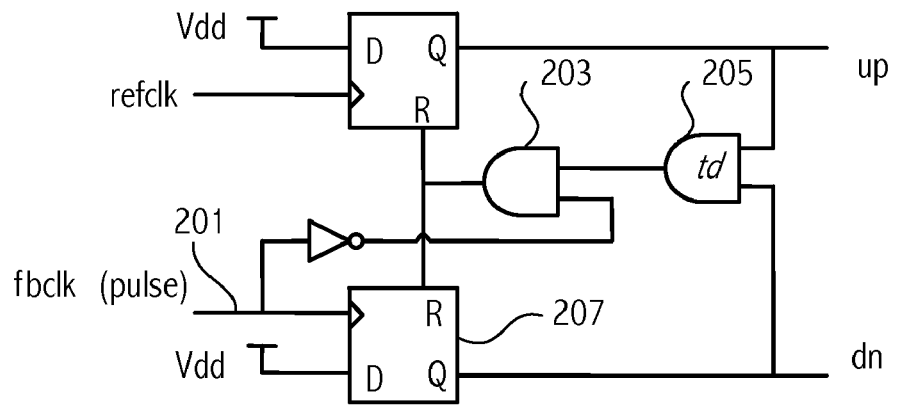
FIG. 2 illustrates a linearizing PFD according to an embodiment of the invention.

Referring to FIG. 2, a linearizing PFD is illustrated that provides charge pump linearization to address mismatch nonlinearity according to an embodiment of the invention. Given that the rising edges of the up and down pulses are triggered by rising edges of the reference clock (refclk) and the feedback clock (fbclk), the charge Q can be linearized by making the down pulse a constant-width, $t_p$. The down pulse is made wide enough to accommodate the quantization noise on fbclk, so that the up pulse always rises (with certain exceptions noted below) before the down pulse falls. Also, in the linearizing PFD, the up pulse is made to fall when the down pulse falls due to the fall of the fbclk. Note that the feedback clock (fbclk) should be a constant-width pulse, instead of a 50% duty cycle clock. The fbclk pulse can be generated in the feedback clock divider and retimed with the VCO clock, and the pulse $t_p$ is typically two to four VCO clock periods long. In an embodiment, the fbclk pulse is made inside the feedback clock divider using a small state machine in the feedback divider that generates the back edge (falling edge) of the fbclk a fixed number of VCO clock periods after the front edge of the fbclk. Both the front and back edges of the fbclk pulse are retimed with the VCO clock. In other embodiments, the small state machine is moved into the linearizing PFD and retimed with the VCO clock in the PFD. Alternatively, the fbclk (pulse) could be generated with a one-shot either in the divider or in the PFD.

For the linearizing PFD to behave in the same way as the classical PFD during frequency acquisition, fbclk (pulse) should not be stuck high. The up pulse falls when the down pulse falls, that is, when the fbclk pulse on node 201 falls, the AND gate 203 output resets the D flip-flops, assuming that refclk has been received and the up pulse rose before the fbclk pulse falls. A NAND gate realization of the linearizing PFD is shown in FIG. 4, where all inputs and outputs are in inverted sense.

Figure 1A:
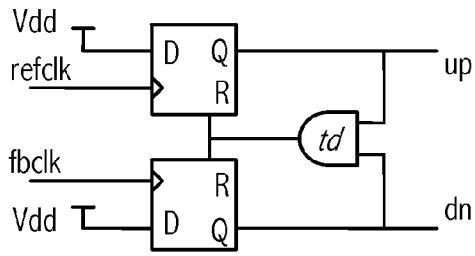
FIG. 1A illustrates a typical PFD used to drive a charge pump in a PLL.
Figure 1B:
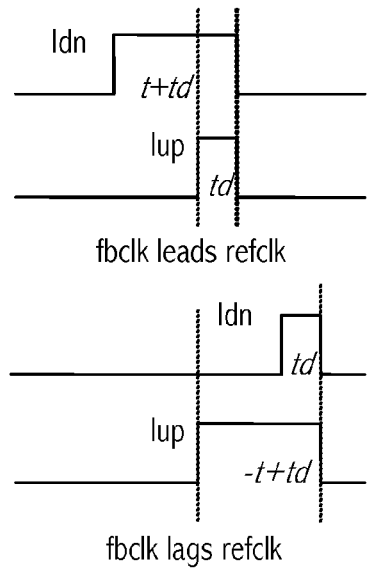
FIG. 1B illustrates a timing diagram associated with the PFD of FIG. 1A.
Figure 1C:
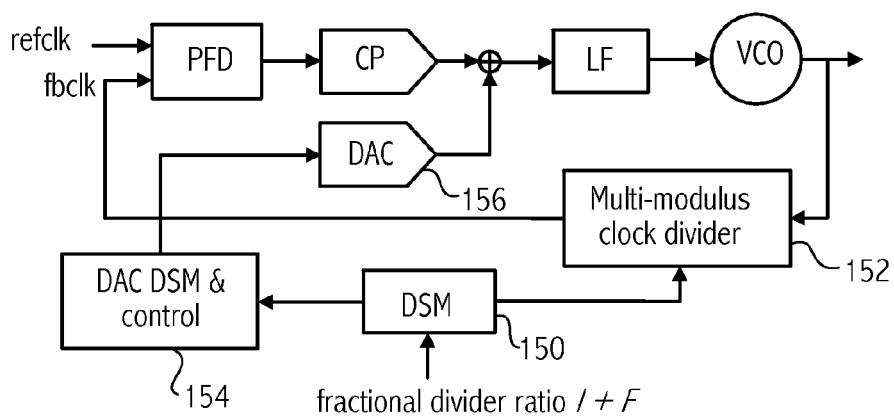
FIG. 1C illustrates a quantization noise reduction technique using a dedicated noise canceling DAC.
Figure 3:
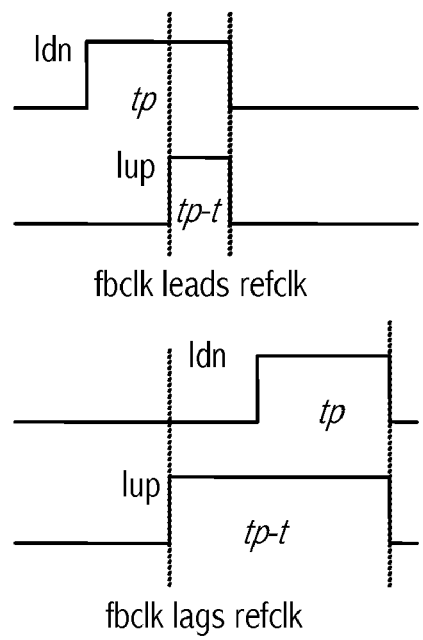
FIG. 3 illustrates a timing diagram associated with the linearizing PFD of FIG. 2.

FIG. 3 shows the timing of the up and down CP current pulses when fbclk leads or lags the refclk for the embodiment shown in FIG. 2. In both cases, the charge $Q=I_{up}\cdot(-t)+I_{up}\cdot t_p - I_{dn}\cdot t_p$. Since the $I_{dn}$ contribution to Q is constant, mismatch nonlinearity is eliminated. When refclk lags fbclk by more than $t_p$, during PLL frequency acquisition, for instance, the down pulse should be extended to fall together with the up pulse, at time $t_d$ after up pulse rises. Thus, AND gate 205 ensures the down pulse is extended by ensuring that flip-flop 207 is not reset. In this case, the modified PFD behaves like the tri-state PFD shown in FIG. 1A.

Quantization Noise Reduction

Having linearized the charge pump with a constant-width down current pulse and causing the up pulse to fall with the down pulse, a quantization noise reduction technique according to an embodiment uses the down current itself as the cancellation DAC.

The quantization noise of fractional-N division from the DSM is directly proportional to the VCO clock period, $T_{VCO}$. Imagine there is a "quantization noise reduction VCO" (RVCO) that runs at four times the VCO frequency and is phase aligned to the VCO. If an RVCO clock edge, instead of a VCO clock edge, is used to generate the fbclk and the down pulse rising edges, it would be four times closer to the rising edge of the up pulse. The quantization noise is reduced by a factor of four, if a "quantization noise reduction delta-sigma modulator" (RDSM), similar to the DSM, is used with another clock divider to generate fbclk from RVCO. The divide ratio of this clock divider is approximately four times that of the original clock divider. Meanwhile, the falling edge of the down pulse should remain in the previous location based on the VCO clock edge. This is depicted in FIGS. 5A and 5B. Edges A and C are the rising and falling edge locations of the original down pulse, both aligned with VCO clock edges. Edges B and C are the rising and falling edge locations of the down pulse based on RDSM. Edge B is aligned with a RVCO clock edge, but not necessarily a VCO clock edge. In FIG. 5A, where fbclk leads refclk, the shaded area 501 represents quantization noise charge reduction if the feedback clock edge was moved from A to B. In FIG. 5B, where refclk leads fbclk, the shaded area 503 represents quantization noise charge reduction achieved assuming the charge represented by the shaded area 503 is supplied to the charge pump.

Consider an example where $t_p=4\cdot T_{VCO}$, and RVCO clock period is $T_{VCO}/4$. Remember, $t_p$ represents a constant-width down pulse. Referring to FIG. 5C, assume the DSM (controlling the feedback divider) chooses VCO clock edge A for the rising edge of the down pulse, whereas the RDSM chooses RVCO clock edge B for the rising edge of the down pulse, and B is $(3/4)T_{VCO}$ before A. The falling edge of the down pulse is C for both cases, where RVCO and VCO clock edges overlap. C is $4\cdot T_{VCO}$ behind A. That is, the RDSM requires a down current pulse that is $I_{dn}$ in amplitude and $$\frac{3}{4}T_{VCO} + 4\cdot T_{VCO} = \left(\frac{19}{16}\right)\cdot 4T_{VCO}$$

in width. In reality, RVCO and associated clock edges do not exist. However, the same charge can be injected by a down current pulse that is $$\left(\frac{19}{16}\right)\cdot I_{dn}$$

in amplitude and $4\cdot T_{VCO}$ in width, based on the VCO clock and the DSM rather than requiring an RVCO. Instead of a single current source of amplitude $I_{dn}$, the CP down current is implemented as 32 current source units of $$\left(\frac{1}{16}\right) \cdot I_{dn}$$

each, and 19 of them are turned on in this case.

As is typical with current-DAC based quantization noise cancellation schemes, desired pulse-width modulation is replaced by feasible pulse-amplitude modulation. Here, turning on each current source unit adds $T_{VCO}/4$ to the effective down pulse width, and turning on between zero and 32 units corresponds to an effective pulse width of zero to $8T_{VCO}$. On average over time, both DSM and RDSM would choose a location of the down pulse rising edge that aligns with the up pulse rising edge. Therefore, there are 16 current source units active on average to provide a charge, on average, equal to that delivered by the up pulse. Instead of eliminating quantization noise entirely, the quantization noise reduction technique aims to suppress it so that it is significantly below the noise of the rest of the system.

System Implementation

Figure 6:
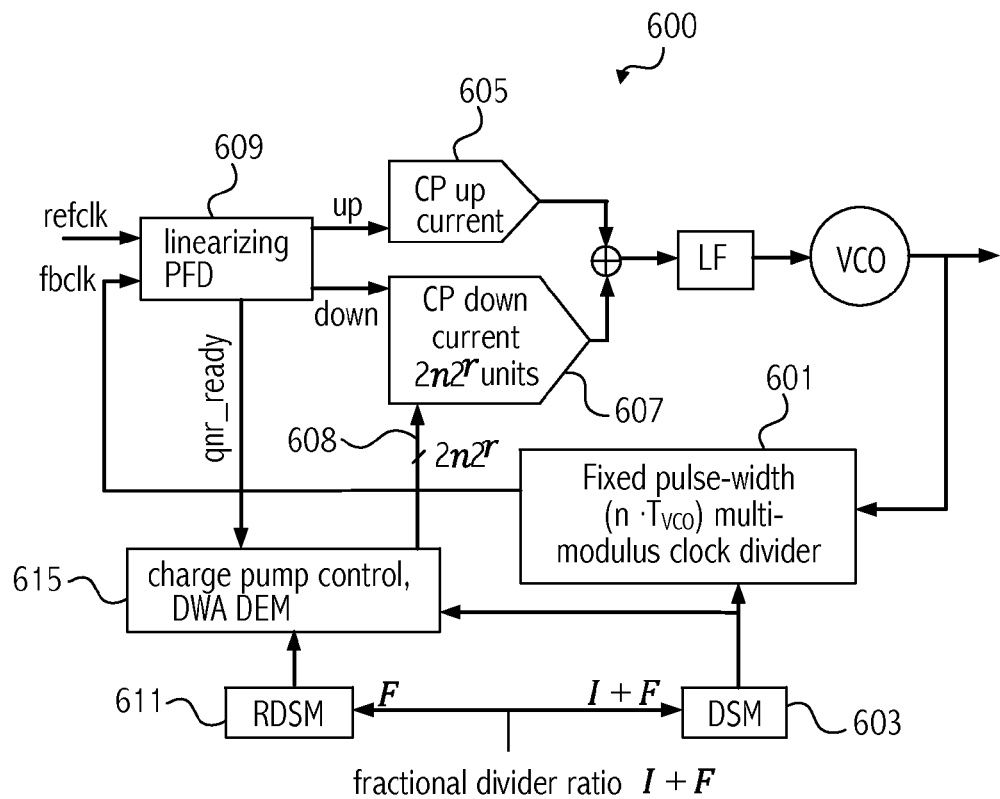
FIG. 6 illustrates an exemplary fractional-N PLL 600 with charge pump linearization and quantization noise reduction according to an embodiment of the invention.

An exemplary fractional-N PLL 600 with charge pump linearization and quantization noise reduction according to an embodiment of the invention is shown in FIG. 6. The feedback multi-modulus clock divider 601 is controlled by the DSM 603 as usual, except that its output is a short pulse of a fixed number n of VCO clock periods. Note that for the value of n, smaller is better, but $n \cdot T_{VCO}$ should be long enough to accommodate half of peak-to-peak DSM quantization noise with margin. The fbclk and refclk drive the CP 605 and 607 through the linearizing PFD 609. To reduce the quantization noise of the DSM by r bits or 6r dB, the down current source 607 is doubled as compared to the up current source 605 and split into $2n \cdot 2^r$ equal units, $n \cdot 2^r$ of which are used on average. In an exemplary embodiment, the current source 605 supplies 160 to and the current source 607 is implemented as thirty-two 10 µA current source units, where n=4 and r=2. Each unit corresponds to a fbclk phase increment of $T_{VCO}/2^r$. The fictitious RVCO runs $2^r$ times faster than the VCO, and the divide ratio of the associated clock divider would be approximately $2^r$ times greater.

In an exemplary embodiment, the PLL 600 is a type-II fractional-N PLL with a dual-path loop filter in which the integrating path charge pump currents are scaled down from those of the direct path, yet they are controlled by the same up and down pulses from the same PFD. Since the integrating path has low gain for the quantization noise, the reduction technique may be applied to the direct path only. The PLL shown in FIG. 6 is exemplary and noise reduction may be applied to other types of PLLs including those with different loop filters and a different number of down current sources.

The fractional divider ratio is I+F, where I is the i-bit integer part and F is the f-bit fractional part. The fractional portion F is supplied to RDSM 611. The charge pump control logic 615 supplies $2n \cdot 2^r$ control signals 608 to control the $2n \cdot 2^r$ current units in the charge pump down current portion 607 of the charge pump. In the embodiment illustrated, the charge pump control logic 615 is implemented using data weighted averaging dynamic element matching ((DWA DEM) in order to suppress the noise generated by the amplitude variation among the $2n \cdot 2^r$ down current source units. Other embodiments may utilize any other appropriate mismatch-shaping dynamic element matching algorithm according to the requirements of the particular implementation.

Figure 7:
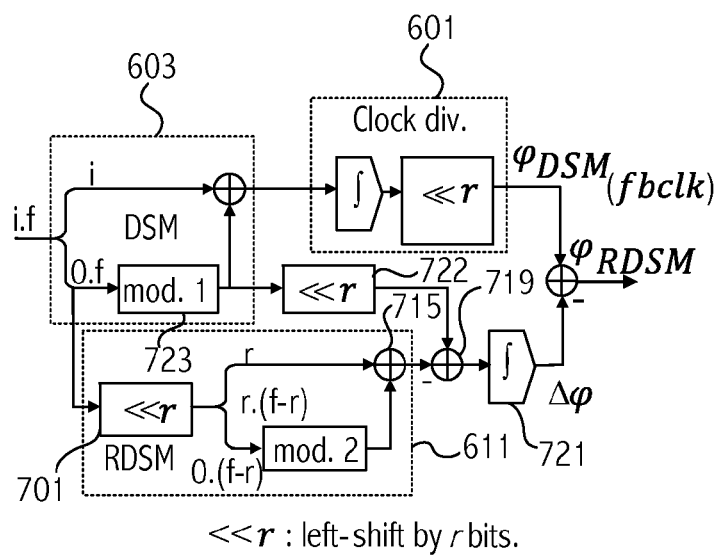
FIG. 7 illustrates an embodiment of charge pump control logic according to an embodiment of the invention.

The charge pump control logic is conceptually shown in FIG. 7. The DSM 603 modulates F into a time-varying integer and adds it to I. The sum is the clock divider ratio. In RDSM 611, the fraction F is left shifted by r bits in 701 to generate the (f−r) LSBs of F, which are modulated by RDSM into another time-varying integer, and added to the r MSBs of F in summer 715. If this sum is then added to $I \cdot 2^r$, the result would be the divide ratio of a clock divider based on the hypothesized RVCO clock that generates the rising edge of the down current pulse located at B in FIGS. 5A and 5B. Instead, this sum is used with the DSM output to calculate the phase lead of the desired RVCO clock edge over fbclk, denoted Opp, in units of $T_{VCO}/2^r$. The output of summer 715 is subtracted from a left-shifted output of the modulated F in summer 719. That difference is integrated in integrator 721 to provide the phase lead $\Delta\phi$. The phase of a clock edge is the time at which it occurs, in unit of $T_{VCO}/2^r$. Referring back to FIGS. 5A, 5B, and 5C, $\Delta\phi$ can be seen as the phase lead of edge B over edge A. If $\Delta\phi$ is positive, that means that the RVCO edge (B) comes before (earlier in time than) the fbclk edge (A). The phase of the desired RVCO clock edge, denoted $\phi_{RDSM}$, is obtained by subtracting $\Delta\phi$ from the phase of fbclk, denoted $\phi_{DSM}\Delta\phi+n \cdot 2^r$ is the number of down current source units to be turned on for the present fbclk cycle, where $\Delta\phi$ has a zero average over time. Referring back to FIGS. 2 and 3, the fixed width dn pulse determines how long the down current is supplied (the width of the current pulse) and the fixed value $(n \cdot 2^r)$ and the variable value $\Delta\phi$ determine the magnitude of the dn current. Thus, e.g., assume n=4 and r=2, when $\Delta\phi=0, 16$ current sources are turned on $(n \cdot 2^r)$. Referring to FIG. 5B, if $\Delta\phi$ is positive, then additional charge is required to reduce the quantization error and more than 16 current source elements are selected. If $\Delta\phi$ is negative, as shown in FIG. 5A, fewer than 16 current source elements are selected. In an exemplary embodiment, both the DSM and RDSM are third-order modulators. In an actual embodiment, there is no need to calculate $\phi_{RDSM}$ or $\phi_{DSM}$ as shown in FIG. 7. Only $\Delta\phi$, the phase difference between the actual feedback clock and the hypothesized feedback clock, needs to be calculated. Note that while one particular embodiment may utilize 32 equal sized current source elements, other embodiments may use weighted current source elements of different sizes and/or a different number of current source elements to provide the down pulse charge.

Figure 8:
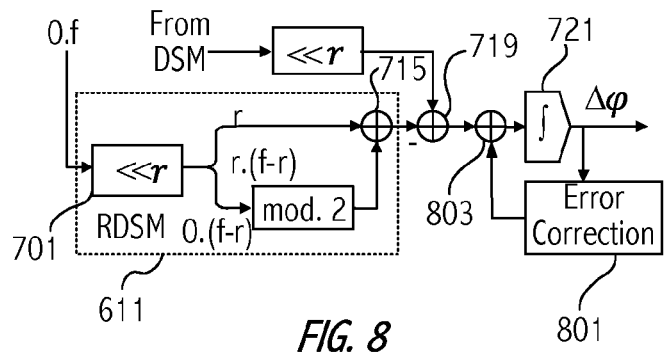
FIG. 8 illustrates a self correcting mechanism that may be used in an embodiment.

Referring to FIG. 8, illustrated is a self correcting monitor 801 that averages the number of current source elements that are active. If the average is different from a predetermined number of current source elements, e.g., 16, then a signal is provided to summer 803 to adjust the value supplied to integrator 721, which in turn adjusts $\Delta\phi$ to get the average back to zero. In that way, any errors that happen to occur can be corrected.

FIG. 7 also shows that the quantization noise of the DSM contributes to $\phi_{RDSM}$ via two paths with gains of the same amplitude but opposite sign. The first path is from the output of the modulator one (mod. 1) 723 in DSM 603 through clock divider 601. The second path is from the output of the modulator one 723 through left-shifter 722 and integrator 721. That quantization noise is cancelled out in $\phi_{RDSM}$ if there is no analog mismatch.

Pulse-width Invariant PFD

The residual errors associated with the quantization noise reduction come from several sources. (1) The cancellation DAC in the form of the down current source units has its own quantization noise, which is proportional to the period of RVCO. (2) The amplitude mismatch between the up and down current sources results in imperfect cancellation of the DSM quantization noise. (3) The width of the down pulse may deviate from $n \cdot T_{VCO}$, resulting in error in the charge delivered. At low frequencies this is equivalent to an amplitude mismatch of the down current with up current. Any mismatch between the rise and fall time of the down pulse is equivalent to a width deviation of the down pulse and is included here. (4) Mismatch among the down current source units creates error, although this error is substantially modulated out of the bandwidth of the PLL by dynamic element matching. (5) The shape mismatch of the up and down current pulses due to pulse-width versus pulse-amplitude modulation manifests as imperfect cancellation at high frequencies. (6) Due to different path delays in the PFD and CP circuits, the up and down current pulses may be systematically skewed in phase, even when shape mismatch is disregarded.

Figure 9:
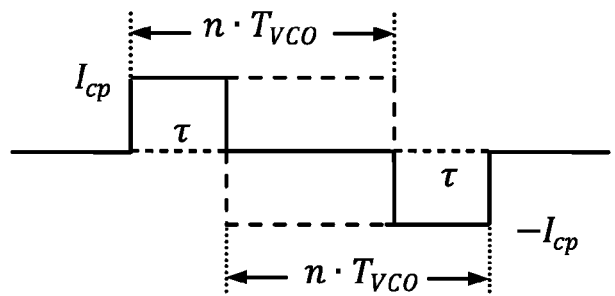
FIG. 9 illustrates an identically shaped pair of up and down current pulses with a systematic skew.

The second error is equal to the original DSM noise times the relative mismatch, and has the same spectral shaping as the original quantization noise. The second and third errors can be reduced by trimming the up current source relative to the down current source. For an identically shaped pair of up and down current pulses of amplitude $\pm I_{cp}$ and systematic skew of $\tau$, as shown in FIG. 9, the amplitude of Fourier transform is $$|F(f)| = 2\tau I_{cp} \cdot \frac{\sin(\pi \tau f)}{\pi \tau f} \cdot \sin(\pi n T_{VCO} f)$$

where the low frequency content is proportional to $\tau$. Therefore, the sixth error above is reduced by minimizing $\tau$.

Figure 10:
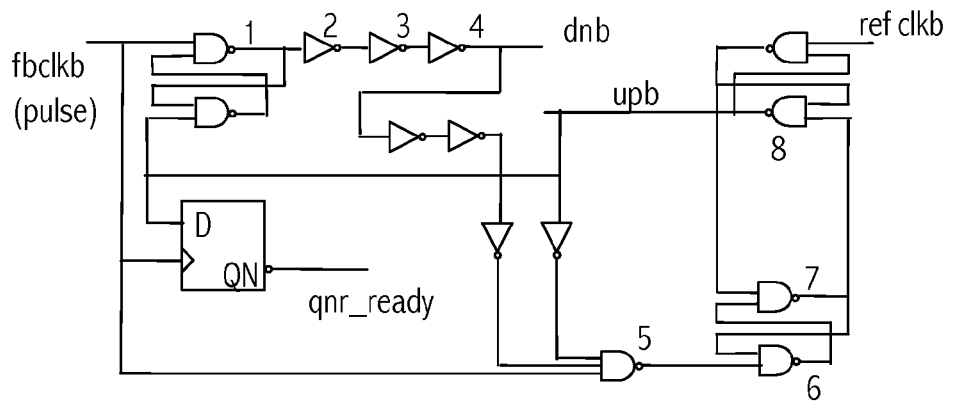
FIG. 10 illustrates pulse width invariant PFD according to an embodiment of the invention.

In the linearizing PFD embodiment of FIG. 4, the rising edges (back edges) of upb and dnb are well aligned, both at four gate delays after the rising edge of fbclkb. However, the dnb pulse is longer than the fbclkb pulse of length $n \cdot T_{VCO}$, because its rising edge delay is two gate delays (1-2) while the falling edge delay is four gate delays (3-4-5-2). This causes the third error listed above. The linearizing PFD is therefore modified into the pulse-width invariant PFD (PWI PFD) to overcome this shortcoming, an embodiment of which is shown in FIG. 10, which also has inverted logic sense on inputs and outputs. While the upb pulse is produced by a D flip-flop in this PFD, the dnb pulse is generated by a single RS latch. The logic and timing of operation of the embodiment shown in FIG. 10 takes advantage of the fact that the rising edge of fbclkb should trigger the reset of dnb and is self explanatory to those skilled in the art. At the rising edge of fbclkb, both upb and dnb are cleared after four gate delays (1-2-3-4 versus 5-6-7-8).). Since the falling and rising edges of dnb are triggered by the falling and rising edges of fbclkb, respectively, both after four gate delays (1-2-3-4), the dnb pulse preserves the fbclkb pulse width of $n \cdot T_{VCO}$.

During frequency and phase acquisition, the refclkb falling edge may arrive after the rising edge of fbclkb. The PWI PFD extends the down pulse width beyond $n \cdot T_{VCO}$, just as the linearizing PFD does. In this case, the basis for the quantization noise reduction technique is not valid, and the technique may interfere with the locking process. A "quantization noise reduction ready" indicator, qnr_ready, is created by latching the down pulse output dnb with fbclkb into a D flip-flop. Quantization noise reduction is active only when qnr_ready is high. Otherwise, exactly $n \cdot 2^r$ down current source units should be used.

Note that for the PWI PFD to behave in the same way as the classical PFD during frequency acquisition, fbc/kb (pulse) should not be stuck low. The PWI PFD can replace the linearizing PFD in FIGS. 2 and 4 for use in quantization noise reduction, whereas the linearizing PFD of FIGS. 2 and 4 is suitable for stand-alone use in charge pump linearization.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A method of reducing quantization noise comprising:
supplying a first current with a first polarity from a first current source according to a first pulse signal from a phase frequency detector; and
supplying a second current with a second polarity from a second current source according to a fixed-width second pulse signal and according to a predetermined first value and a variable second value, the variable second value corresponding to a phase difference between a feedback clock signal and a desired location of the feedback clock signal.

2. The method as recited in claim 1 wherein the desired location of the feedback clock signal is based on a hypothesized feedback clock signal.

3. The method as recited in claim 1 further comprising turning on individual ones of current source elements forming the second current source, according to the phase difference and the predetermined first value.

4. The method as recited in claim 3 further comprising determining an average of how many of the current source elements are turned on over time and adjusting a number of current source elements turned on to be a predetermined number of current source elements if the average is not the predetermined number of current source elements.

5. The method as recited in claim 3 wherein the predetermined first value corresponds to a current that is equal and opposite to the first current from the first current source.

6. The method as recited in claim 1 further comprising:
modulating a fractional portion F of a number that includes an integer portion I and the fractional portion F, the fractional portion having (f) bits, to generate a first time varying integer, the number being used to control a feedback divider;
left shifting the fractional portion F by an integer (r) number of bits and modulating the (f-r) least significant bits of F into a second time varying integer and adding the second time varying integer to (r) most significant bits of the fractional portion F to generate a first sum.

7. The method as recited in claim 6 further comprising:
subtracting the first sum from the modulated fractional portion F, after the modulated fractional portion F is left-shifted by r bits, to generate a difference;
integrating the difference to generate the phase difference that corresponds to the second variable value.

8. The method as recited in claim 6 wherein the desired location of the feedback clock signal is based on a hypothesized feedback clock signal and the hypothesized feedback clock signal is based on a hypothesized oscillator output signal that is $2^r$ times faster in terms of frequency than an actual oscillator output signal used to generate the feedback clock signal and that is phase aligned to the actual oscillator output signal.

9. The method as recited in claim 1 wherein the first current source is the up current source and the second current source is the down current source.

10. The method as recited in claim 1 further comprising performing both functions of charge pump and quantization noise reduction in the first and second current sources.

11. An apparatus comprising:
a phase frequency detector;
a first current source to supply a first charge amount responsive to a first pulse signal from the phase frequency detector; and
a second current source to supply a second charge amount according to a fixed value and according to a variable value, the variable value corresponding to a phase difference between a first feedback clock signal and a hypothesized feedback clock signal, where the first and second charge amounts are of opposite polarity.

12. An apparatus comprising:
a phase frequency detector;
a first current source to supply a first current of a first polarity responsive to a first pulse signal from the phase frequency detector; and
a second current source to supply a second current of a second polarity responsive to a fixed-width second pulse signal and according to a fixed value combined with a variable value, the variable value selected to reduce quantization error associated with a feedback divider circuit.

13. The apparatus as recited in claim 12 wherein the second current source comprises individually controllable unit current sources, and a fixed number of the individually controllable unit current sources correspond to the fixed value and the fixed number is adjusted according to the variable value to enable a number of the individually controllable unit current sources to provide the second current.

14. The apparatus as recited in claim 13 wherein, on average, the fixed number of current sources are turned on.

15. The apparatus as recited in claim 12 further comprising an error correction circuit coupled to average the number of current source elements turned on and to adjust a number of current source elements turned on to make the average the fixed number of the current source elements.

16. The apparatus as recited in claim 12 further comprising a phase-locked loop including the phase frequency detector, the first and the second current sources, a loop filter coupled to the first and second current sources, and a controlled oscillator coupled to the loop filter and adjusted according to a difference between the first and second charge amounts supplied respectively by the first and second currents.

17. The apparatus as recited in claim 12 wherein the variable value corresponds to a phase difference between a feedback clock signal and a hypothesized feedback clock signal.

18. The apparatus as recited in claim 17 further comprising:
the feedback divider circuit;
a first circuit to modulate a fractional portion F with (f) bits, of a number that includes an integer I and the fractional portion F, to generate a first time varying integer, the number being used to control the feedback divider circuit;
a shift circuit to left shift the fractional portion F by an integer (r) number of bits;
a second circuit to modulate (f-r) least significant bits of F into a second time varying integer; and
a summer circuit to add the second time varying integer to r most significant bits of the fractional portion F to generate a first sum.

19. The apparatus as recited in claim 18 further comprising:
a difference circuit to subtract the first sum from the modulated fractional portion F, after the modulated fractional portion F is left-shifted by r bits, to generate a difference;
an integrator to integrate the difference to generate the phase difference corresponding to the variable value.

20. The apparatus as recited in claim 18 wherein the first and second circuit comprise, respectively, first and second delta sigma modulators.

21. The apparatus as recited in claim 12 wherein the first current source is the up current source and the second current source is the down current source.

22. The apparatus as recited in claim 12 wherein the fixed-width second pulse signal determines how long the second current is supplied and the fixed value and the variable value determine magnitude of the second current.

23. The apparatus as recited in claim 12 wherein the phase frequency detector is a pulse with invariant phase frequency detector wherein the down pulse preserves a pulse width of a feedback clock pulse width.

24. The method as recited in claim 1 further comprising:
determining a pulse width of the second current based on the fixed-width second pulse signal; and
determining a magnitude of the second current based on the predetermined first value and the variable second value.

* * * * *

UNITED STATES PATENT AND TRADEMARK OFFICE
CERTIFICATE OF CORRECTION

| | | |
|---|---|---|
| PATENT NO. | : 8,207,766 B2 | Page 1 of 1 |
| APPLICATION NO. | : 12/732029 | |
| DATED | : June 26, 2012 | |
| INVENTOR(S) | : Qicheng Yu | |

It is certified that error appears in the above-identified patent and that said Letters Patent is hereby corrected as shown below:

In the Specification

In col. 5, line 36, please replace --160 to-- with "160 µA";

In col. 6, line 9, please replace --Opp-- with "Δφ".

Signed and Sealed this
Twenty-fifth Day of February, 2014

Michelle K. Lee
*Deputy Director of the United States Patent and Trademark Office*